United States Patent [19]
Itozaki et al.

[11] Patent Number: 5,820,948
[45] Date of Patent: Oct. 13, 1998

[54] APPARATUS AND METHOD FOR DEPOSITING FILMS ON SUBSTRATE VIA OFF-AXIS LASER ABLATION

[75] Inventors: Hideo Itozaki; Tatsuoki Nagaishi, both of Itami, Japan

[73] Assignee: Sumitomo Electric Industries, Ltd., Osaka, Japan

[21] Appl. No.: 609,242

[22] Filed: Mar. 1, 1996

[30] Foreign Application Priority Data

Mar. 7, 1995 [JP] Japan .................................. 7-074422

[51] Int. Cl.⁶ ........................... C23C 14/30; B23K 26/06
[52] U.S. Cl. .......................... 427/596; 427/597; 427/561; 505/474; 219/121.76; 219/121.85
[58] Field of Search ..................... 427/596, 597, 427/561, 568, 586; 505/474; 219/121.76, 121.77, 121.85

[56] References Cited

U.S. PATENT DOCUMENTS

| | | | |
|---|---|---|---|
| 4,537,791 | 8/1985 | Tarjan ..................................... | 427/586 |
| 5,096,739 | 3/1992 | Strutt et al. ............................. | 427/597 |
| 5,304,281 | 4/1994 | Wang ..................................... | 427/596 |
| 5,322,817 | 6/1994 | James et al. ............................. | 427/596 |
| 5,405,659 | 4/1995 | Fernandez ............................... | 427/596 |
| 5,406,906 | 4/1995 | Rimai et al. ............................. | 427/596 |
| 5,411,772 | 5/1995 | Cheung ................................... | 427/586 |
| 5,624,722 | 4/1997 | Nagaishi et al. ......................... | 427/586 |

FOREIGN PATENT DOCUMENTS

| | | | |
|---|---|---|---|
| 91/19827 | 12/1991 | European Pat. Off. ............... | 427/596 |
| 702416 | 3/1996 | European Pat. Off. . | |
| 4008266 | 1/1989 | Japan ..................................... | 427/596 |
| 2231587 | 11/1990 | United Kingdom . | |

| | | |
|---|---|---|
| WO92/13113 | 8/1992 | WIPO . |
| WO94/01595 | 1/1994 | WIPO . |

OTHER PUBLICATIONS

Chrisey et al, ed. *Pulsed Laser Deposition of Thin Films*, John Wiley & Sons, Inc., New York, 1994 (no month), excerpts p. 18, 167–168, 192–193, 294–296 and 1318.

Holzapfel et al, Off–axis laser deposition of $YBa_2Cu_3O_{7-\delta}$ thin films, Applied Physics Letters, vol. 61, no. 26, Dec. 28, 1992 pp. 3178–3180. Dec.

*Primary Examiner*—Marianne Padgett
*Attorney, Agent, or Firm*—Beveridge, DeGrandi, Weilacher & Young, LLP

[57] ABSTRACT

The apparatus for depositing thin films on both a first surface and a second surface of the substrate via off-axis laser ablation according to present invention comprises (1) a vacuum chamber, the vacuum chamber having (a) a first target of a first deposition material supported by a first target holder, (b) a second target of a second deposition material supported by a second target holder so as to positioned to be substantially coplanar with the first target, (c) a substrate holder for holding a substrate above a space between the first and second targets, the substrate being oriented to be substantially perpendicular to the targets, (d) a heating means for heating the first and second surfaces of the substrate, (e) a first entrance window through which a first laser beam passes to impinge onto the first target with a predetermined angle, and (f) a second entrance window through which a second laser beam passes to impinge onto the second target with a predetermined angle and (2) a laser optical system comprising at least one laser beam source and an optical path system from said laser beam source to said targets, the optical path system including mirrors for reflecting the laser beams toward the targets through the first and second entrance windows of the chamber.

2 Claims, 5 Drawing Sheets

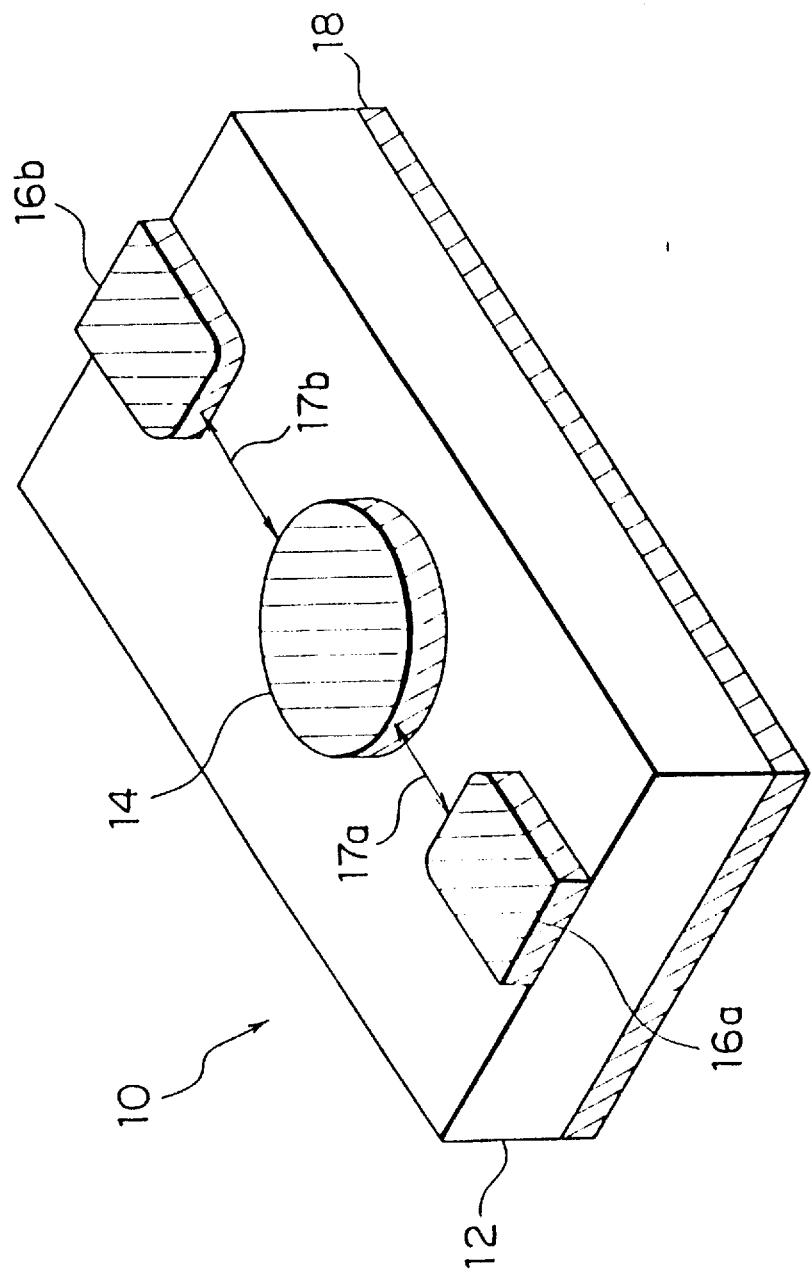

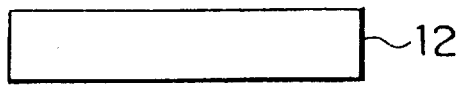
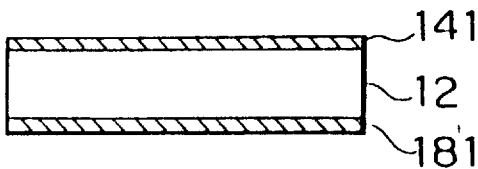
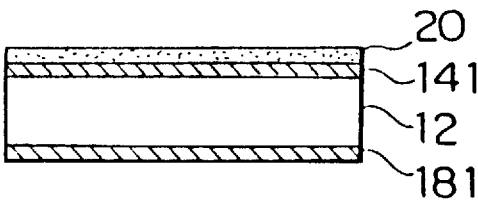
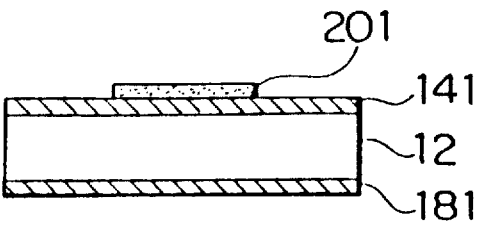
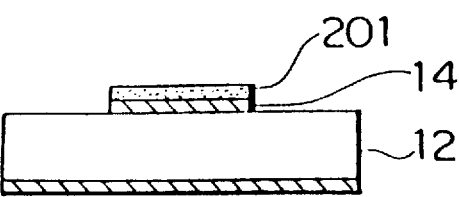
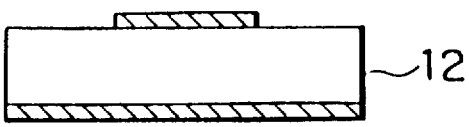

APPARATUS AND METHOD FOR DEPOSITING FILMS ON SUBSTRATE VIA OFF-AXIS LASER ABLATION

BACKGROUND OF THE INVENTION

1. Field of the Invention

The present invention relates to a deposition process via laser ablation. More particularly, the present invention is suitable for forming electronic and microwave devices comprising oxide compounds.

2. Related Background Art

Laser ablation is one of the most suitable deposition process for producing excellent quality of thin films on substrate or workpiece. Laser ablation process has advantages, such as excellent stoichiometric stability of deposited film, when the process is used for depositing films of complex metal oxide compounds such as $Y_1Ba_2Cu_3O_{7-x}$. There is another advantage in Laser ablation processing that it requires no electromagnetic fields which may possibly affect the charged particle contained in the deposited film. Therefore, laser ablation is expected to be employed as deposition process for the most promising nearterm devices.

Higaki et al (Institute of Electronics, Information and Communication Engineers, advanced conference paper, Apr. 26, 1991, hereinafter called "Reference 1") describes that a planar-type disk resonator formed when a thin layer of $Y_1Ba_2Cu_3O_{7-x}$ (referred to as "YBCO") is deposited by sputtering has excellent characteristics for the use in the microwave/millimeter-wave fields, such as temperature dependence of the surface resistance.

As described in the Reference 1, qualities of a thin film of oxides, such as crystallinity, are particularly important for microwave devices.

FIG. 5 shows an exploded perspective view of a resonator disclosed in the Reference 1. As shown in FIG. 5, a resonator 100 in accordance with Reference 1 has a configuration, in which a center dielectric layer 108 having a circular thin film 106 and rectangular thin films 107a and 107b thereon is sandwitched between an underlying lower dielectric layer 104 having a lower ground plane 102 of a gold thin film on its surface and an overlying upper dielectric layer 112 having an upper ground plane 110 of a gold thin film, by adhesion of these dielectric layers.

However, since the center dielectric layer is adhered to both the upper and the lower dielectric layer to form the device, high-frequency characteristics of the device may be affected with the adhesion condition.

Holzapfel et.al. describes that c-axis oriented epitaxial thin films of $YBa_2Cu_3O_{7-x}$ had been formed on both the front and the back surfaces of a substrate having (100) plane of $LaAlO_3$ and $SrTiO_3$ by the laser ablation of off-axis arrangement [Holzapfel, B, et al., Applied Physics Letters, 61(26), pp. 3178–3180, 28 Dec. 1992, hereinafter called "Reference 2"]. The disclosure of the Holzapfel et.al. is hereby incorporated by reference.

The Reference 2 suggests a possibility of forming thin films of oxides on both upper and lower surfaces of a dielectric substrate, thereby forming ground planes onto the dielectric substrate to produce resonator. However, Reference 2 does not describe any useful method for forming acceptable films on both upper and lower surfaces in one process for superior electronic or microwave devices.

Therefore, it is desirable to provide a method for forming more reliable member used for microwave devices by employing laser ablation.

SUMMARY OF THE INVENTION

The apparatus for depositing thin films on both a first surface and a second surface of the substrate according to present invention comprises (1) a vacuum chamber which is thermally resistant at a temperature of 200° C., the vacuum chamber having (a) a first target of a first deposition material supported by a first target holder, (b) a second target of a second deposition material supported by a second target holder so as to positioned to be substantially coplanar with the first target, (c) a substrate holder for holding a substrate above a space between the first and second targets, the substrate being oriented to be substantially perpendicular to the targets, (d) a heating means for heating the first and second surfaces of the substrate, (e) a first entrance window through which a first laser beam passes to impinge onto the first target with a predetermined angle, and (f) a second entrance window through which a second laser beam passes to impinge onto the second target with a predetermined angle and (2) a laser optical system comprising at least one laser beam source and an optical path system from said laser beam source to said targets, the optical path system including mirrors for reflecting the laser beams toward the targets through the first and second entrance windows of the chamber.

The method for depositing thin films according to the present invention comprises the steps of, (a) disposing a first target and a second target within the vacuum chamber, the first target being positioned to be substantially coplanar with the second target; (b) disposing a substrate above a space between the first and second targets, the substrate is oriented to be substantially perpendicular to the targets; (c) heating the substrate with a heating means; and (d) directing the first and second laser beams to the first and second targets, respectively, to form a first plume over the first target and a second plume over the second target, the axis of the first plume being substantially parallel to the first surface,of the substrate and the axis of the second plume being substantially parallel to the second surface of the substrate, wherein said first plume contacts the first surface and the second plume contacts the second surface, thereby depositing the first deposition material on the first surface and thereby depositing the second deposition material on the second surface.

According to the present invention, one target is disposed near the front surface (first surface or upper surface) of the substrate and another target is disposed near the back surface (second surface or lower surface) of a substrate, with off-axis geometry. Each of these targets has their own laser beam path to the target. In this arrangement, different laser beam strikes each of the targets, and different "plume" is created over each of the targets, thereby each of these surfaces of the substrate is deposited with different plume. Therefore, thin films with an excellent quality and an uniform thickness distribution can be simultaneously formed on both sides of the substrate. Further, since respective targets and laser beams are used for these surfaces, the deposition rates on the front and the back surfaces can be separately controlled, while it is also possible for the thin films to be formed on both surfaces with the same deposition rate.

Consequently, layers of conductor or high-temperature superconductor can be formed on both upper and lower surfaces of a single substrate, thereby high-frequency devices can be produced with the favorable high-frequency characteristics and the improved reliability.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

These and other features, aspects, and advantages of the present invention will become better understood with reference to the following description, appended claims, and accompanying drawings, where;

FIG. 1 is a perspective view schematically showing a microwave resonator manufactured in accordance with the present invention;

FIGS. 2A, 2B, 2C, 2D, 2E, and 2F are cross-sectional views schematically showing a microwave resonator formed in accordance with the present invention, respectively representing states thereof in successive steps of a manufacturing method in accordance with the present invention;

DETAILED DESCRIPTION OF THE PREFERRED EMBODIMENTS

Vapor Deposition Apparatus

Figure 3:
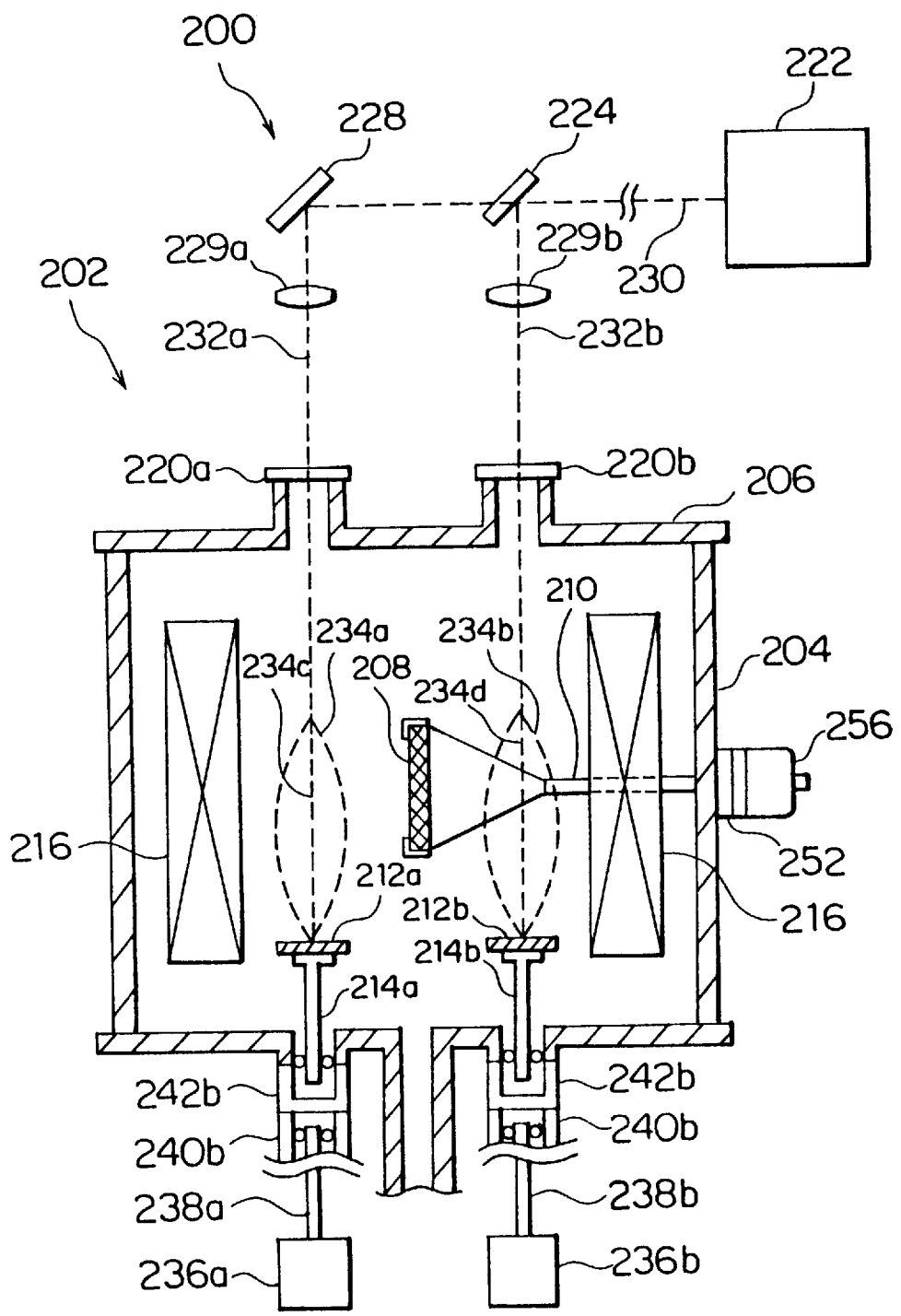
FIG. 3 is a cross-sectional view showing a laser ablation apparatus which is preferably used for performing a manufacturing method in accordance with the present invention.

FIG. 3 is a cross-sectional view showing the laser ablation apparatus according to the present invention. In the following, the laser ablation apparatus used in the preferable embodiment according to the present invention will be explained with reference to FIG. 3.

As shown in FIG. 3, a laser ablation apparatus 200 of the illustrated embodiment according to the present invention comprises a cylindrical processing chamber 202. The evacuable chamber 202 is externally defined by a body 204 made of stainless (SUS304) and a lid 206 made of SUS304. The chamber 202 includes a substrate holder 210 for holding a substrate 208 and target holders 214a and 214b for holding targets 212a and 212b. Both targets are made of a target material such as metal oxide. The target material of the first target 212a may be different from the target material of the second target 212b, if desired.

As shown in FIG. 3, the two target holders 214a and 214b are provided with respect to the single substrate holder 210 in the laser ablation processing chamber 202 according to the present invention. The target 212a is positioned in one side (front surface side) of the substrate 208, and the target 212b is positioned in another side (back surface side).

The second target 212b is positioned to be substantially coplanar with the first target 212a, as shown in FIG. 3. The substrate 208 is positioned above a space between the first and second targets, and the substrate 208 is oriented to be substantially perpendicular to the targets. The distance between the substrate 208 and each of the targets 212a and 212b is about 5 to about 10 cm.

As shown in FIG. 3, the chamber 202 includes within the chamber 202 a cylindrical heater 216 which efficiently heats the substrate 208 such that the substrate can have a uniform temperature distribution.

The heater 216 is capable of being controlled so as to adjust the output power to the desired level for the increasing substrate temperature during the deposition due to the change of the optical absorption index of the substrate.

Next, the laser optical system of the laser ablation apparatus 200 will be explained. In this apparatus 200, a laser beam source is disposed outside of the chamber. As shown in FIG. 3, the chamber 202 has entrance windows 220a and 220b through which laser beams pass and enter the chamber 202. The laser beam optical system comprises a laser beam source 222, a half mirror 224, a total reflection mirror 228, and condenser lenses 229a and 229b. Both of the entrance windows 220a and 220b are made of synthetic quartz having a thickness of 10 mm. The laser beam source 222 is equipped with a KrF excimer laser source for emitting a laser having a wavelength of 248 nm. Alternatively, this laser source may be of ArF excimer laser having a wavelength of 193 nm or of XeCl excimer laser having a wavelength of 308 nm.

The laser beam emitted from the laser beam source 222 (indicated by dotted line 230) enters the half mirror 224. The half mirror 224 reflects a part of the laser beam(50% of the total intensity), while transmitting the other part of the laser beam(another 50% of the total intensity). Therefore, the single laser beam 230 entering the half mirror 224 splits into two beams (indicated by dotted lines 232a and 232b), and the two laser beams respectively pass through condenser lenses 229a and 229b and enter the entrance windows 220a and 220b, respectively.

The type of the laser beam system available to the present invention is not limited to the illustrated embodiment shown in FIG. 3. For example, two laser sources may be provided for the two targets. In this manner, deposition rates at the front and the back surfaces of the substrate can separately be controlled, by adjusting each of the laser beam energies of the two laser beam source, respectively.

During striking of the laser beam onto the target surfaces, atoms of metal oxide on the surfaces of targets 212a and 212b are activated and sublimed to form plumes (schematically depicted with dotted curves 234a and 234b), whereby the atoms of the target material are released and reach the substrate 208, thereby being deposited on the substrate surfaces. The plumes 234a and 234b are respectively formed with axes 234c and 234d.

Here, the arrangement of the substrate and the targets is the off-axis oriented arrangement. More specifically, the substrate 208 is disposed so as to substantially parallel to the axes 234c and 234d of plumes, or in other words, the surface of the substrate is oriented so as to form an angle of about −30° (deg.) to +30° (deg.) with respect to the axes 234c and 234d of the plumes. Since a plume is formed with an axis perpendicular to a target surface, the deposition surface of substrate is disposed so as to have an angle ranging from about 60° to about 120° with respect to the target surface.

Since the mirrors 228a and 228b for reflecting laser beams are fixed, the laser beam path are also affixed to reach onto predetermined locations of the targets 212a and 212b, thereby cause non-uniform consumption of the targets. In order to avoid the non-uniform consumption of the targets, the targets are rotated such that the laser can be incident on a certain range of area.

As shown in FIG. 3, the mechanism for rotating targets in the laser ablation apparatus 200 comprises motors 236a and 236b, shafts 238a and 238b, tubes 240a and 240b for holding the shafts, and coupling portions 242a and 242b are provided. An end portion of each of the shafts 238a and 238b on the chamber side and an end portion of each of the target holders 214a and 214b on the chamber wall side are respectively equipped with magnets (not depicted), whereby rotational movements of the shafts 238a and 238b provided by the motors 236a and 236b are transmitted to the target holders 214a and 214b by magnetic connection, respectively. By means of such terminals for introducing magnetic coupling rotation, the targets 212a and 212b are rotated.

Also, in order to uniformly deposit the target material such as metal oxide complex onto the substrate, the laser ablation apparatus includes a mechanism for rotating the substrate.

As shown in FIG. 3, a motor 256 for rotating the substrate holder 210 and a terminal 252 for introducing magnetic coupling are provided.

EXAMPLES (Manufacture of Microwave Resonator by Laser Ablation Apparatus Shown in FIGS. 3) In the following Examples 1 to 6, members for a microwave resonator were manufactured while using various metal oxides as target materials and an single crystalline MgO plate as a substrate for depositing target materials. All the Examples 1 through 6 were carried out by using substantially same procedure and materials, except the metal oxides to be deposited.

FIG. 1 is a perspective view showing a member for the microwave resonator manufactured in this example. Here, in order to facilitate representation, FIG. 1 is depicted with exaggeration and, accordingly, does not always correspond to the numerical values in the following explanation. As shown in FIG. 1, a microwave resonator member 10 comprises, on an MgO single crystal plate 12, a circular film 14 and substantially rectangular films 16a and 16b which are made of metal oxide complex, and also comprises, under the MgO 12, a ground plane film 18 which is similarly made of metal oxide. The MgO plate 12, which is a dielectric, has a dimension of: a length of 20 mm, a width of 10 mm, and a thickness of 0.5 mm. The circular film 14 has a dimension of: a diameter of 5 mm and a thickness of 0.5 $\mu$m. Each of the substantially rectangular films 16a and 16b has a dimension of: a length of 7 mm, a width of 1 mm, and a thickness of 0.5 $\mu$m, while being separated from the circular film 14 by a distance (indicated by arrow 17a or 17b) of 0.5 mm. The ground plane film 18 is formed on the whole lower surface of the MgO single crystal plate 12 with a uniform thickness of 0.5 $\mu$m.

FIGS. 2A to 2F are cross-sectional views sequentially showing the steps for manufacturing the microwave resonator in this example. With reference to these drawings, the outline of the method for making the microwave resonator in this example will be explained. First, on the upper and lower surfaces of the dielectric 12 shown in FIG. 2A, oxide films 141 and 181 are simultaneously formed, respectively (FIG. 2B). Then, a photoresist is coated on the whole upper surface of the oxide film 141 so as to form a photoresist layer 20 (FIG. 2C). After being exposed to light by using a mask, the whole laminate is immersed in a developing liquid, whereby a photoresist pattern 201 is formed on the surface of the oxide film (FIG. 2D). Then, the oxide is removed by etching such that only a part of the oxide film that is protected by the pattern 201 is left (FIG. 2E; FIGS. 2E and 2F showing only the cross section of the circular film 14 shown in FIG. 1 without showing that of the rectangular films). Finally, the photoresist pattern 201 is removed so as to accomplish a desired microwave resonator.

Example 1

In Example 1, the laser ablation apparatus shown in FIG. 3 was used to form thin films of a metal oxide on both front and the back surfaces of the MgO single crystal plate, i.e., dielectric, and then these layers were etched into predetermined patterns so as to manufacture a microwave resonator such as that shown in FIG. 1.

In Example 1, $Y_1Ba_2Cu_3O_{7-X}$ (hereinbelow referred "YBCO") was used as the metal oxide. As the dielectric substrate, a MgO single crystal plate which had a (100) plane and whose both surfaces had been subjected to mirror polishing was used. The single crystal MgO substrate had a dimension of 40 mm×40 mm×0.5 mm. The targets were made of $Y_1Ba_2Cu_3O_{7-X}$.

(1: Forming of YBCO Thin Film on Both Sides of MgO Single Crystal Substrate (FIG. 2B))

In Examples 1 to 6, while using various metal oxides as target materials and an MgO single crystal plate as a substrate for members, films of the metal oxides were formed on the MgO single crystal plate in the off-axis oriented laser ablation apparatus shown in FIG. 3. Then, in the steps similar to those of Example 1, members for a microwave resonator such as that shown in FIG. 1 were manufactured. Examples 1 to 6 were identical to each other except for their kinds of metal oxides to be deposited.

In Example 1, $YBa_2Cu_3O_{7-X}$ was used as the metal oxide. As the dielectric substrate, a MgO single crystal plate which had a (100) plane and whose both surfaces had been subjected to mirror polishing was used. This MgO single crystal substrate had a size of 40 mm×40 mm×0.5 mm.

Conditions for laser ablation in this example were as follows. First, after the atmosphere within the chamber was reduced to $10^{-5}$ Torr, a flow of $O_2$ gas was supplied into the chamber such that the pressure within the chamber was maintained at 400 mTorr. Then, electric power was supplied to the heater and this condition was maintained until the substrate temperature was stabilized at 650° to 700° C. In cases where a thermocouple has been placed near the substrate within the chamber beforehand to measure its temperature under various conditions of internal pressure and electric power, for example, thereby determining calibration curves concerning the electric power to the substrate temperature under the respective conditions, the temperature can be controlled, with a favorable reproducibility, solely based on manipulation of electric power. Then, the targets were rotated at 20 rpm, while the substrate was rotated. Electric power was supplied to the laser source (KrF laser having a wavelength of 248 nm) so as to make it generate a laser with a laser output of about 5 W. At this time, the frequency of the laser pulse was 5 Hz, while each pulse had a laser energy of 0.5 J/pulse.

Thus emitted laser impinged on the half mirror. The two lasers split within the half mirror impinged on the targets disposed within the chamber respectively through the entrance windows whose surfaces had been coated with non-reflective coatings. In this example, each target was formed as a disk having a diameter of 20 mm, while the laser irradiation area on the target surface was 10 mm² (irradiation area of 2 mm×5 mm). The laser energy density of the split single laser was 1.5 to 2.0 J/cm² after having been partially lost as the laser passed through the half mirror or the total reflection mirror. Accordingly, the laser energy was 150 to 200 mJ.

In this example, the respective targets were placed at off-axis positions, while separate lasers were incident thereon. In this example, the angle at which the respective lasers (depicted with dotted lines 232a and 232b) were incident on the surfaces of the targets 212a and 212b was 90° (deg). Also, in order to prevent the targets from being locally consumed due to the fact that the laser impinged on a single point of the target surface, the targets were rotated while the laser was made incident on a position dislocated from the rotational axis. As a result, the laser was incident on a wide area on the target surface.

Also, the substrate was rotated in order to uniformly form the YBCO film on the whole surface thereof. As shown in FIG. 3, on the surfaces of the targets 212a and 212b irradiated with the laser beams, YBCO constituting the target surface is sublimed so as to form plumes such as those depicted by dotted curves 234a and 234b. The amount of vapor deposition is the largest in the proximity of the axis or center of the plume and gradually decreases as the distance from the axis increases. Accordingly, if the substrate is fixed, there will be a certain distribution in the thickness of the thin film deposited on the surface. In order to avoid such problem, the substrate was rotated in this example so as to form thin layers without varying film thickness across the entire surface.

More specifically, the substrate in this example is arranged such that the substrate surface has an angle of about −30° (deg.) to about +30° (deg.) with respect to the axes 234c and 234d of the plumes.

The two lasers 232a and 232b shown in FIG. 3 in this example are derived from the single laser 230 which splits by the half mirror 224. Accordingly, these two laser beams can have the same laser energy. Accordingly, energies formed by the respective lasers input to the targets can be made identical to each other. When both front and the back surfaces of the substrate are equally heated by a heater and the distances between the substrate and the respective targets are set equally, an oxide high-temperature superconductor can be easily formed on both front and the back surfaces of the substrate with the same film quality and the same deposition rate. The distance between the surface of each of the target and the center of the substrate was 100 mm, respectively.

At the target surface on which the laser is incident, each atom of Y, Ba, Cu, and O is sublimed and, as an atom, reaches the substrate so as to be deposited thereon. In this manner, the depositing operation was performed about 17 minutes so as to deposit a thin layer of YBCO having a thickness of about 0.5 $\mu$m. In this example, based on the thickness of thus obtained YBCO film and the operation time, the average deposition rate was about 1 angstrom/pulse.

The conductivity of the thin film formed on the MgO substrate in this manner was measured as explained in the following. One of the substrates on which the thin films had been formed was taken out for measuring the conductivity of the thin film and then a bridge of 20 $\mu$m×20 $\mu$m was formed on the thin film on one surface thereof by photolithography and etching. Then, under various temperature conditions, a general four point probe method was used to measure the voltage generated at both sides of the bridge, thereby yielding a resistance value. Thus, the temperature at which the generated voltage becomes not higher than 1 $\mu$V was defined as critical temperature for superconductivity (Tc). In the thin film of this embodiment, Tc was 90 K. Then, at 77 K, the current supplied to the bridge was gradually increased. The current at which a resistance was generated was defined as critical current (Ic). This Ic was divided by the current-passing cross-sectional area of the bridge so as to yield critical current density (Jc). The critical current density of the YBCO thin film manufactured in this example was 3,000,000 A/cm$_2$.

Also, a part of thus obtained YBCO thin film was removed and the resulting step formed at the boundary of the film and substrate was measured by a contact-type surface roughness tester. Similar measurement was performed on the whole surface of the film to determine the thickness distribution of the film. The fluctuation in thickness of the thin film formed in this example was within the range of +/−5% for each of the front and the back surfaces.

(2: Forming of Photoresist Pattern (FIGS. 2C and 2D))

On one surface of the YBCO film formed as mentioned above, a photoresist pattern was formed by a well-known photoresist.

As a photoresist material, without being restricted in particular, commercially available resist materials for silicon semiconductor can be used. For example, as a positive resist material, general positive resist materials such as OFPR-2 (manufactured by Tokyo Ohka Kogyo Co.) and AZ111 (manufactured by Hoechst AG) can be used. Also, as a negative resist material, JSR CIR-712 (manufactured by Japan Synthetic Rubber Co.) or the like can be used.

By a method widely used for the mass production step in the semiconductor manufacturing process, a positive photoresist material was coated and then exposed to light by using a mask, whereby the resist material having a pattern of the circular thin film 14 and substantially rectangular thin films 16a and 16b shown in FIG. 1 was formed on the YBCO thin film.

(3: Etching of YBCO (FIG. 2E))

The YBCO film was etched out leaving the portion protected by the photoresist formed as mentioned above. For the etching, ion milling widely used for the mass production step in the semiconductor manufacturing process was used.

(4: Removal of Resist Material (FIG. 2F))

Finally, the remaining resist material was removed by acetone, thereby accomplishing a microwave resonator member such as that shown in FIG. 1.

(5: Measurement of High-Frequency Characteristic of Microwave Resonator Member)

The high-frequency characteristic of thus formed microwave resonator member was evaluated. This microwave resonator member had a configuration in which an oxide high-temperature superconductor was formed on both front surface (where the circular thin film is formed) and the back surface of the dielectric. Accordingly, a microwave input into this resonator is guided in the horizontal direction, which is directed from one rectangular thin film to the other rectangular thin film through the circular thin film, while being resonated.

The high-frequency characteristic was evaluated as follows. Namely, after the resonator was equilibrated at a temperature of 77 K within a cryostat, a microwave of 5 GHz was input thereto and the resulting Q value was determined. For measuring the Q value, a network analyzer was used.

Figure 4:
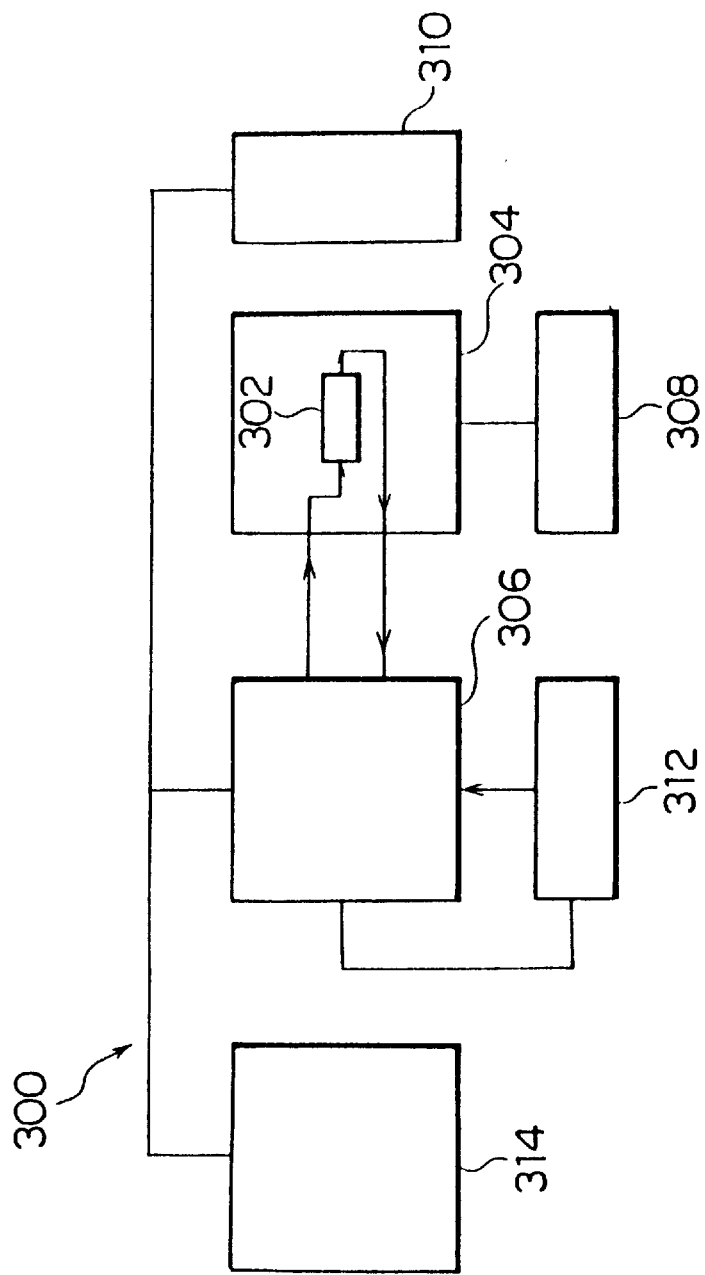
FIG. 4 is a system diagram showing an apparatus for measuring a high-frequency characteristic of a device.
Figure 5:
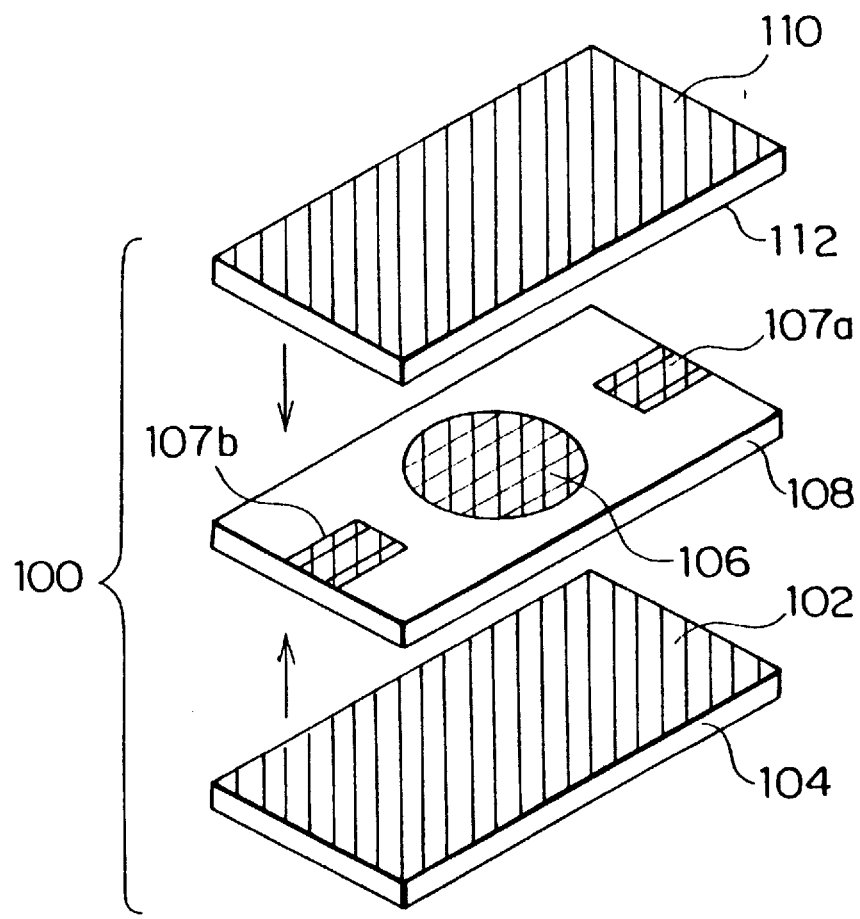
FIG. 5 is an exploded perspective view showing a microwave resonator in accordance with the prior art.

FIG. 4 is a system diagram of an apparatus used for evaluating the high-frequency characteristic of the microwave resonator manufactured in this example. As shown in FIG. 4, a high-frequency characteristic measuring apparatus 300 comprises a cryostat 304, which contains a sample (microwave resonator) 302 so as to equilibrate it at a predetermined temperature, and a network analyzer 306.

The cryostat 304 is equipped with a cooler 308 and a temperature controller 310. The range of temperature which can be controlled by the temperature controller 310 is 30 to 300 K. The network analyzer 306 is connected to a signal source 312 so as to control the latter. The network analyzer 306 and the temperature controller 310 are collectively controlled by a system controller 314. The network analyzer 306 used in this example was the HP8515B (manufactured by Hewlett-Packard Co).

As shown in FIG. 4, the resonator 302 manufactured in this example was set within the cryostat 304 and cooled to a temperature of 77 K. Then, a high-frequency signal of 5 GHz was generated at the signal source 312 and introduced into the network analyzer 306. This 5-GHz high-frequency signal was input into the sample 302 within the cryostat 304 by the network analyzer 306, while the response therefrom was fed back to the network analyzer 306.

The Q value of the microwave resonator manufactured in this example was 50,000 at 77 K. Accordingly, it was confirmed that the microwave resonator using the oxide high-temperature superconductor manufactured in this example had a favorable frequency characteristic.

Example 2

In a manner similar to Example 1, $TlBa_2CaCu_2O_X$ was used as a deposition material for a target so as to deposit $TlBa_2CaCu_2O_X$ on an MgO substrate, thereby forming a microwave resonator, whose high-frequency characteristic was then evaluated.

Thus obtained $TlBa_2CaCu_2O_X$ thin film exhibited a Tc of 95 K and a Jc of 1,000,000 A/cm$^2$ at 77 K. Also, the Q value of thus manufactured resonator was 45,000.

Example 3

$Tl_2Ba_2CaCu_2O_X$ was used as a deposition material for a target so as to deposit $Tl_2Ba_2CaCu_2O_X$ on an MgO substrate, thereby forming a microwave resonator, whose high-frequency characteristic was then evaluated.

Thus obtained $Tl_2Ba_2CaCu_2O_X$ thin film exhibited a Tc of 100 K and a Jc of 1,200,000 A/cm$^2$ at 77 K. Also, the Q value of thus manufactured resonator was 55,000.

Example 4

$Tl_2Ba_2CaCu_2O_X$ was used as a deposition material for a target so as to deposit $Tl_2Ba_2Ca_2Cu_3O_X$ on an MgO substrate, thereby forming a microwave resonator, whose high-frequency characteristic was then evaluated.

Thus obtained $Tl_2Ba_2Ca_2Cu_3O_X$ thin film exhibited a Tc of 115 K and a Jc of 3,000,000 A/cm$^2$ at 77 K. Also, the Q value of thus manufactured resonator was 58,000.

Example 5

$Bi_2Sr_2CaCu_2O_X$ was used as a deposition material for a target so as to deposit $Bi_2Sr_2CaCu_2O_X$ on an MgO substrate, thereby forming a microwave resonator, whose high-frequency characteristic was then evaluated.

Thus obtained $Bi_2Sr_2CaCu_2O_X$ thin film exhibited a Tc of 85 K and a Jc of 800,000 A/cm$^2$ at 77 K. Also, the Q value of thus manufactured resonator was 37,000.

Example 6

$Bi_2Sr_2Ca_2Cu_3O_X$ was used as a deposition material for a target so as to deposit $Bi_2Sr_2Ca_2Cu_3O_X$ on a MgO substrate, thereby forming a microwave resonator, whose high-frequency characteristic was then evaluated.

Thus obtained $Bi_2Sr_1Ca_2Cu_3O_X$ thin film exhibited a Tc of 90 K and a Jc of 900,000 A/cm$^2$ at 77 K. Also, the Q value of the thus manufactured resonator was 42,000.

It should be understood that the preferred embodiments of the invention are given by way of illustration only. From the invention thus described, it will be obvious that the invention may be varied in many ways. For example, as the dielectric substrate, other than MgO, such materials as $LaAlO_3$ having (100) plane, sapphire having R plane ($Al_2O_3$), and $SrTiO_3$ may be used. Such variations are not to be regarded as a departure from the spirit and scope of the invention, and all such modifications as would be obvious to one skilled in the art are intended for inclusion within the scope of the following claims.

The basic Japanese Application No. 074422/1995 (75-074422) filed on Mar. 7, 1995 is hereby incorporated by reference.

What is claimed is:

1. A method for depositing thin films onto a first surface and a second surface of a substrate, said method comprising steps of:

(a) disposing a first target of a first deposition material for depositing film onto said first surface and a second target of a second deposition material for depositing film onto said second surface, said first target being positioned to be substantially coplanar with or parallel to said second target within said chamber;

(b) disposing said substrate at a location above a space between said first target and said second target such that said substrate is oriented to be substantially perpendicular to said first and second targets;

(c) heating said substrate with a heating means; and (d) directing a first laser beam to said first target and a second laser beam to said second target to form a first plume over said first target and a second plume over said second target, said first plume having a first longitudinal axis that substantially is parallel to said first surface of said substrate and said second plume having a second longitudinal axis that substantially is parallel to said second surface of said substrate, wherein, in said step (b), said location locates said substrate between said first longitudinal axis and said second longitudinal axis such that said substrate is remote from each of said first and second longitudinal axes, and such that a side of said first plume contacts said first surface of said substrate and a side of said second plume contacts said second surface of said substrate, thereby depositing said first deposition material on said first surface and thereby depositing said second deposition material on said second surface.

2. A method according to claim 1, wherein, in said step (d) for directing laser beams, (i) both said first and second targets are rotated and (ii) said first laser beam impinges onto a position of said first target surface other than the center of the rotational axis of said first target while said second laser beam impinges onto a position of said second target surface other than the center of the rotational axis of said second target.

* * * * *